United States Patent
Zhao

(10) Patent No.: US 10,367,011 B2
(45) Date of Patent: Jul. 30, 2019

(54) DISPLAY PANEL AND ARRAY SUBSTRATE THEREOF

(71) Applicant: Shenzhen China Star Optoelectronics Technology Co., Ltd., Shenzhen, Guangdong (CN)

(72) Inventor: Yang Zhao, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 137 days.

(21) Appl. No.: 15/520,383

(22) PCT Filed: Apr. 13, 2017

(86) PCT No.: PCT/CN2017/080397
§ 371 (c)(1),
(2) Date: Apr. 19, 2017

(87) PCT Pub. No.: WO2018/145359
PCT Pub. Date: Aug. 16, 2018

(65) Prior Publication Data
US 2018/0301474 A1    Oct. 18, 2018

(30) Foreign Application Priority Data
Feb. 13, 2017    (CN) .......................... 2017 1 0076488

(51) Int. Cl.
*H01L 29/08*    (2006.01)
*H01L 27/12*    (2006.01)
(Continued)

(52) U.S. Cl.
CPC ...... *H01L 27/1244* (2013.01); *G02F 1/13454* (2013.01); *G02F 1/136204* (2013.01);
(Continued)

(58) Field of Classification Search
CPC . H01L 27/124; H01L 27/1244; G02F 1/1335; G02F 1/13452; G02F 1/13454; G02F 1/136204
See application file for complete search history.

(56) References Cited

U.S. PATENT DOCUMENTS

2006/0157710 A1* 7/2006 Lee .................. H01L 27/12
257/72
2006/0197898 A1* 9/2006 Kurasawa ............. G02F 1/1393
349/117
(Continued)

FOREIGN PATENT DOCUMENTS

CN    201174016 Y    12/2008
CN    101626010 A    2/2012
(Continued)

*Primary Examiner* — Phuc T Dang
(74) *Attorney, Agent, or Firm* — Andrew C. Cheng

(57) ABSTRACT

The present invention provides an array substrate, which comprises a display region and a peripheral wiring region, wherein in the peripheral wiring region, gate driving circuits and data driving lines are arranged respectively in correspondence with scanning lines and data lines in the display region and the gate driving circuits are electrically connected to different metal layers arranged in wire on array of the chip on film region to improve the electrostatic protection of the array substrate. Because the array substrate provided by the present invention comprises the wire on array arranged in different metal layers to extend the length of the wire on array and increase the impedance of the wire on array. Thereby the input current of gate driving circuit can be decreased and the probability of gate driving circuit damage can be reduced, the electrostatic protection of the array substrate can be improved.

18 Claims, 4 Drawing Sheets

(51) Int. Cl.
*G02F 1/1362* (2006.01)
*G02F 1/1345* (2006.01)

(52) U.S. Cl.
CPC ............... *G02F 1/136286* (2013.01); *G02F 2001/13629* (2013.01)

(56) References Cited

U.S. PATENT DOCUMENTS

| | | |
|---|---|---|
| 2006/0232738 A1 | 10/2006 | Lin et al. |
| 2010/0283931 A1 | 11/2010 | Horiuchi et al. |
| 2015/0123136 A1 | 5/2015 | Kim et al. |
| 2015/0187312 A1* | 7/2015 | Dai ...................... G09G 3/3648 345/213 |
| 2016/0240129 A1* | 8/2016 | Kim ...................... G09G 3/2092 |
| 2016/0351585 A1* | 12/2016 | Cao ....................... H01L 27/124 |

FOREIGN PATENT DOCUMENTS

| | | |
|---|---|---|
| CN | 202975551 U | 6/2013 |
| KR | 20060015176 A | 2/2006 |

\* cited by examiner

DISPLAY PANEL AND ARRAY SUBSTRATE THEREOF

FIELD OF THE INVENTION

The present invention relates to a technology of display, and more particularly, to a display panel and array substrate thereof.

DESCRIPTION OF PRIOR ART

Liquid crystal display (LCD) with a thin body, power saving, no radiation, long life and many other advantages, so it has been widely used. Such as LCD TV, smart phones, digital cameras, computer screens or laptop screens, etc., so that LCD dominates the flat panel display field.

In the case of the usual LCD screen, in order to simplify the design of display panel, the gate driver is arranged inside the glass substrate and the design is called gate on array (GOA) design. In the normal cases, the left and right side or upper side and lower side of GOA is electrically connected by wire on array (WOA) in the GOA design, the WOA is usually used single metal layer wiring. For highly dense and complex GOA circuit, the single metal layer wiring is easy to case the current which is input into the GOA to be too large, so that the cross-line or the tip between the GOA circuits are damaged easily, and resulting in open circuit and short circuit.

SUMMARY OF THE INVENTION

The present invention provides a display panel and an array substrate thereof to resolve the problem that the single metal layer wiring is easy to case the current which is input into the GOA to be too large, so that the cross-line or the tip between the GOA circuits are damaged easily, and resulting in open circuit and short circuit.

In order to solve deficiencies of prior art described above, the present invention provides an array substrate, wherein the array substrate comprises a display region and a peripheral wiring region.

Wherein the display region comprises a plurality of sub-pixel electrodes are arranged in a matrix manner, and scanning lines arranged in correspondence with each of the sub-pixel electrodes, and data lines arranged in correspondence with each of the sub-pixel electrodes; in the peripheral wiring region, gate driving circuits are arranged in correspondence with each of the scanning lines and data driving lines are arranged in correspondence with each of the data lines, and the gate driving circuits and the data driving lines are electrically connected to a chip on film region of gate driver, each of the gate driving circuits are electrically connected to different metal layers arranged in wire on array of the chip on film region to improve the electrostatic protection of the array substrate.

Wherein the distance between the adjacent wires on array is in the range of 10 to 30 μm, the starting point of each of the wire on array connected to the gate driving circuit and the end point connected to the chip on film region are arranged in the same metal layer.

In order to solve deficiencies of prior art described above, the present invention further provides an array substrate, wherein the array substrate comprises a display region and a peripheral wiring region.

Wherein the display region comprises a plurality of sub-pixel electrodes are arranged in a matrix manner, and scanning lines arranged in correspondence with each of the sub-pixel electrodes, and data lines arranged in correspondence with each of the sub-pixel electrodes; in the peripheral wiring region, gate driving circuits are arranged in correspondence with each of the scanning lines and data driving lines are arranged in correspondence with each of the data lines, and the gate driving circuits and the data driving lines are electrically connected to a chip on film region of gate driver, each of the gate driving circuits are electrically connected to different metal layers arranged in wire on array of the chip on film region to improve the electrostatic protection of the array substrate.

According to the embodiment of the present invention, the starting point of each of the wire on array connected to the gate driving circuit and the end point connected to the chip on film region are arranged in the same metal layer.

According to the embodiment of the present invention, the different metal layers comprise a first metal layer and a second metal layer, the wire on array of the first metal layer and the second metal layer both has a length range of more than 100 μm.

According to the embodiment of the present invention, the wire on array of the first metal layer and the second metal layer is electrically connected via a through hole of a gate insulating layer.

According to the embodiment of the present invention, the diameter of the through hole is equal to the width of the wire on array.

According to the embodiment of the present invention, the width of the wire on array is in the range of 10 to 30 μm.

According to the embodiment of the present invention, the first metal layer comprises a plurality of first metal segments, the second metal layer comprising a plurality of second metal segments, and the plurality of first metal segments is electrically connected to the plurality of corresponding second metal segments.

According to the embodiment of the present invention, the wire on array is further divided into a first wire on array region and a second wire on array region, the plurality of the first metal segments of the first wire on array region and the plurality of the first metal segments of the second wire on array region are arranged separately in the same layer.

According to the embodiment of the present invention, the distance between the adjacent wires on array is in the range of 10 to 30 μm.

In order to solve deficiencies of prior art described above, the present invention further provides a display panel, the display panel comprises a housing and an array substrate described above, wherein the array substrate comprises a display region and a peripheral wiring region.

Wherein the display region comprises a plurality of sub-pixel electrodes are arranged in a matrix manner, and scanning lines arranged in correspondence with each of the sub-pixel electrodes, and data lines arranged in correspondence with each of the sub-pixel electrodes; in the peripheral wiring region, gate driving circuits are arranged in correspondence with each of the scanning lines and data driving lines are arranged in correspondence with each of the data lines, and the gate driving circuits and the data driving lines are electrically connected to a chip on film region of gate driver, each of the gate driving circuits are electrically connected to different metal layers arranged in wire on array of the chip on film region to improve the electrostatic protection of the array substrate.

According to the embodiment of the present invention, the starting point of each of the wire on array connected to the gate driving circuit and the end point connected to the chip on film region are arranged in the same metal layer.

According to the embodiment of the present invention, the different metal layers comprise a first metal layer and a second metal layer, the wire on array of the first metal layer and the second metal layer both has a length range of more than 100 μm.

According to the embodiment of the present invention, the wire on array of the first metal layer and the second metal layer is electrically connected via a through hole of a gate insulating layer.

According to the embodiment of the present invention, the diameter of the through hole is equal to the width of the wire on array.

According to the embodiment of the present invention, the width of the wire on array is in the range of 10 to 30 μm.

According to the embodiment of the present invention, the first metal layer comprises a plurality of first metal segments, the second metal layer comprising a plurality of second metal segments, and the plurality of first metal segments is electrically connected to the plurality of corresponding second metal segments.

According to the embodiment of the present invention, the wire on array is further divided into a first wire on array region and a second wire on array region, the plurality of the first metal segments of the first wire on array region and the plurality of the first metal segments in the second wire on array region are arranged separately in the same layer.

According to the embodiment of the present invention, the distance between the adjacent wires on array is in the range of 10 to 30 μm.

The present invention can be concluded with the following advantages, the array substrate provided by the present invention is different from the prior art of arranging the wire on array in different metal layers to extend the length of the wire on array and increase the impedance of the wire on array. Thereby the input current of gate driving circuit can be decreased and the probability of gate driving circuit damage can be reduced, the electrostatic protection of the array substrate can be improved.

BRIEF DESCRIPTION OF DRAWINGS

In order to give a better and thorough understanding to the whole and other intended purposes, features and advantages of the technical solution of the present invention, detailed description will be given with respect to preferred embodiments provided and illustrated here below in accompanied drawings. Apparently, with the spirit of the embodiments disclosed, person in the skilled in the art can readily come out with other modifications as well as improvements without undue experiment. In addition, other drawings can be readily achieved based on the disclosed drawings.

DESCRIPTION OF PREFERRED EMBODIMENT

Technical implementation will be described below clearly and fully by combining with drawings made in accordance with an embodiment in the present invention. Obviously, the described embodiments are merely part of embodiment of the present invention, not at all. Based on the embodiments of the present invention, on the premise of embodiments in the absence of creative work, all other embodiments are in the scope of protection in the present invention.

Figure 1:
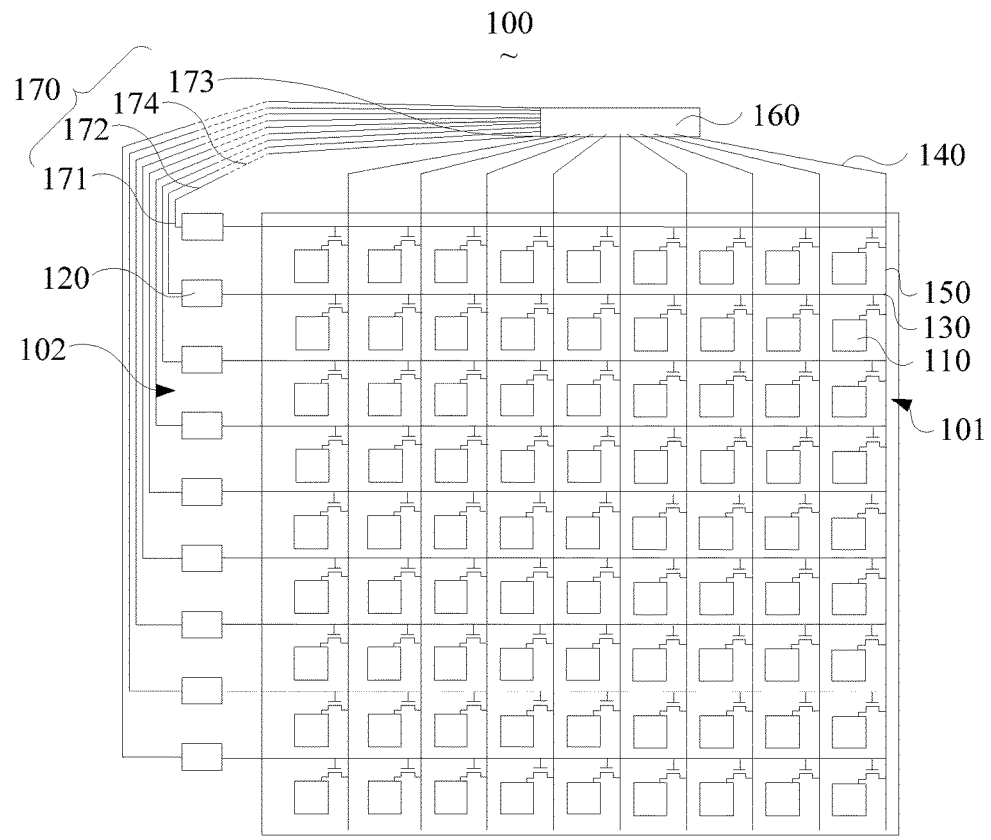
FIG. 1 is a structural illustration of the first embodiment made in accordance to an array substrate in the present invention.
Figure 2:
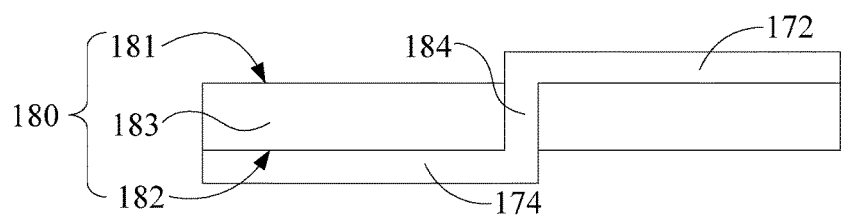
FIG. 2 is a cross sectional view of a wire on array in different metal layers made in accordance with the first embodiment in the present invention.

Referring to FIGS. 1 and 2, FIG. 1 is a structural illustration of the first embodiment made in accordance to an array substrate in the present invention and FIG. 2 is a cross sectional view of a wire on array in different metal layers made in accordance with the first embodiment in the present invention.

As shown in FIG. 1, the array substrate 100 comprises a display region 101 and a peripheral wiring region 102, the peripheral wiring area 102 is arranged on the periphery of the display area 101. In the present embodiment, the peripheral wiring area 102 is arranged on the left and the upper side of the display area 101.

Wherein the display region 101 comprises a plurality of sub-pixel electrodes 110 are arranged in a matrix manner, and scanning lines 130 arranged in correspondence with each of the sub-pixel electrodes 110, and data lines 150 arranged in correspondence with each of the sub-pixel electrodes 110.

In the peripheral wiring region 102, gate driving circuits 120 are arranged in correspondence with each of the scanning lines 130 and data driving lines 140 are arranged in correspondence with each of the data lines 150, and the gate driving circuits 120 and the data driving lines 140 are electrically connected to a chip on film region 160 of gate driver, each of the gate driving circuits 120 are electrically connected to different metal layers 180 arranged in wire on array 170 of the chip on film region 160, as shown in FIG. 2. In the present embodiment, the dotted line and the solid line do not belong to the same metal layer, thereby the electrostatic protection of the array substrate 100 can be improved.

Because the array substrate 100 provided by the present invention comprises the wire on array 170 arranged in different metal layers 180 to extend the length of the wire on array 170 and increase the impedance of the wire on array 170. Thereby the input current of gate driving circuit 120 can be decreased and the probability of gate driving circuit 120 damage can be reduced, the electrostatic protection of the array substrate 100 can be improved.

Referring to FIG. 2, for convenience of explanation, a cross sectional view of a wire on array in different metal layers is illustrated as an example. The different metal layers 180 comprise a first metal layer 181, a second metal layer 182, and an insulating layer 183 for isolating the first metal layer 181 and the second metal layer 182. The insulating layer 183 is an insulating layer at least containing an insulating material, i.e., a multi-layer insulating layer or a single-layer insulating layer. Material of the insulating layer can be selected as epoxy resin.

The wire on array 170 comprises a starting point 171 and an end point 173, and further comprises a first wire on array 172 of the first metal layer 181 and a second wire on array 174 of the second metal layer 182. Wherein, the starting point 171 of each of the wire on array 170 connected to the gate driving circuit 120 and the end point 173 connected to the chip on film region 160 are arranged in the same metal layer, it may be the first metal layer 181 or the second metal layer 182. The length of the first wire on array 172 of the first metal layer 181 and the second wire on array 174 of the second metal layer 182 are both larger than 100 µm, and the optional length is 200 µm, 300 µm or 350 µm, etc. The actual application example can be adjusted according to the specific array substrate size.

In the present embodiment, the insulating layer 183 separating the first metal layer 181 and the second metal layer 182 is a gate insulating layer, a through hole 184 is arranged in the gate insulating layer 183, the first wire on array 172 of the first metal layer 181 and the second wire on array 174 of the second metal layer 182 are electrically connected via the through hole 184 of a gate insulating layer 183. The diameter of the through hole 184 may be greater than, less than, or equal to the width of the wire on array 170; preferably, the diameter of the through hole 184 is equal to the width of the wire on array 170. Wherein the width of the wire on array 170 is in the range of 10 to 30 µm; further, the width of the wire on array 170 is in the range of 15 to 25 µm; preferably, the width of the wire on array 170 is 20 µm. The distance between the adjacent wires on array 170 is in the range of 10 to 30 µm; further, the distance between the adjacent wires on array 170 is in the range of 15 to 25 µm; preferably, the distance between the adjacent wires on array 170 is 20 µm.

In the present embodiment, the plurality of first array wires 172 and the plurality of second array wires 174 are arranged at the corner positions of the wires on array 170, the wires on array 170 in different metal layers may be also used at other straight line positions. The wire on array between the start point 171 and the end point 173 may be arranged in different metal layers and may also be subjected to a multi-stage design. Details will be described below, therefore no additional description is given herebelow.

Figure 3:
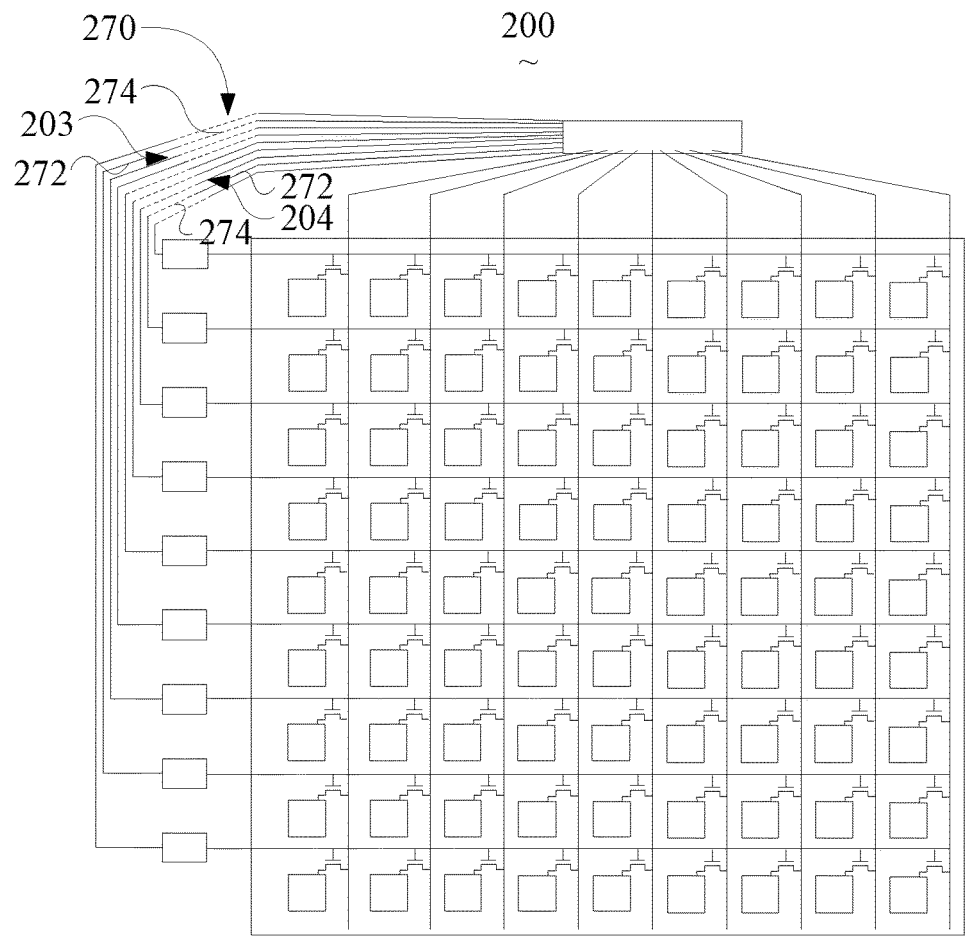
FIG. 3 is a structural illustration of the second embodiment made in accordance to an array substrate in the present invention.

Referring to FIG. 3, FIG. 3 is a structural illustration of the second embodiment made in accordance to an array substrate in the present invention.

As shown in FIG. 3, for convenience of explanation, a cross sectional view of a wire on array in different metal layers is illustrated as an example. The structure of the present embodiment is basically the same as that of the first embodiment. the wire on array 270 of array substrate 200 is further divided into a first wire on array region 203 and a second wire on array region 204, wherein a plurality of first wires on array 272 of the first wire on array region 203 and the plurality of first wires on array 272 of the second wire on array region 204 are arranged separately in the same layer. Similarly, a plurality of second wires on array 274 of the first wire on array region 203 and the plurality of second wire on array 274 of the second wire on array region 204 are arranged separately in the same layer.

Figure 4:
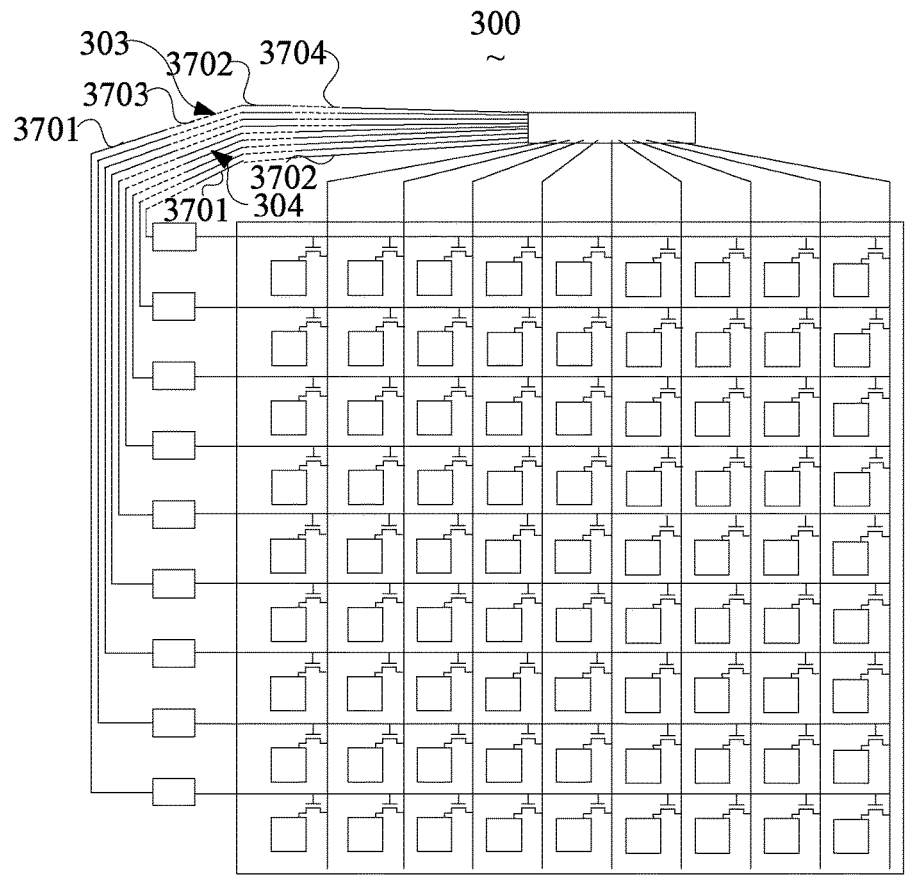
FIG. 4 is a structural illustration of the third embodiment made in accordance to an array substrate in the present invention.
Figure 5:
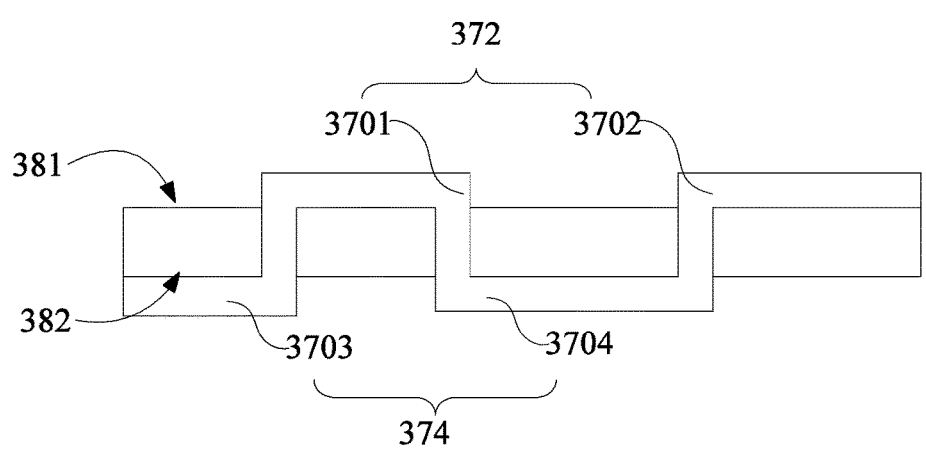
FIG. 5 is a cross sectional view of a wire on array in different metal layers made in accordance with the third embodiment in the present invention.

Referring to FIG. 4 and FIG. 5, FIG. 4 is a structural illustration of the third embodiment made in accordance to an array substrate in the present invention, FIG. 5 is a cross sectional view of a wire on array in different metal layers made in accordance with the third embodiment in the present invention.

As shown in FIG. 5, for convenience of explanation, a cross sectional view of a wire on array in different metal layers is illustrated as an example. The structure of the present embodiment is basically the same as that of the first embodiment. The different is that a first metal layer 381 of the array substrate 300 comprises a plurality of first metal segments 3701 and a first metal segment 3702, i.e., a first wire on array 372; a second metal layer 382 comprises a plurality of second metal segments 3703 and a second metal segment 3704, i.e., a first wire on array 374. The plurality of first metal segments are electrically connected to the corresponding plurality of second metal segments. The lengths of the first metal segment 3701 and the first metal segment 3702 may be equal or unequal, and the lengths are both greater than 100 µm; similarly, the lengths of the second metal segment 3703 and the second metal segment 3704 may be equal or unequal, and the lengths are both greater than 100 µm. In the present embodiment, the first metal layer 381 comprises two first metal segments, and may comprise three, four, or more in other embodiments, therefore no additional description is given herebelow.

Referring to FIG. 4, the plurality of the first metal segments 3701 and the first metal segment 3702 of the first wire on array region 303 are arranged in the same layer, the plurality of the second metal segments 3703 and the second metal segment 3704 are arranged in another layer, wherein, the plurality of the first metal segments 3701 and the first metal segment 3702 of the second wire on array region 304, and the plurality of the first metal segments 3701 and the first metal segment 3702 of the first wire on array region 303 are arranged separately in the same layer. Because the array substrate of the present embodiment comprises the plurality of first metal segments 3701 and the plurality of second metal segments 3703 arranged in different metal layers, the length of the wire on array can be further extended, so the electrostatic protection of the array substrate can further be improved.

Figure 6:
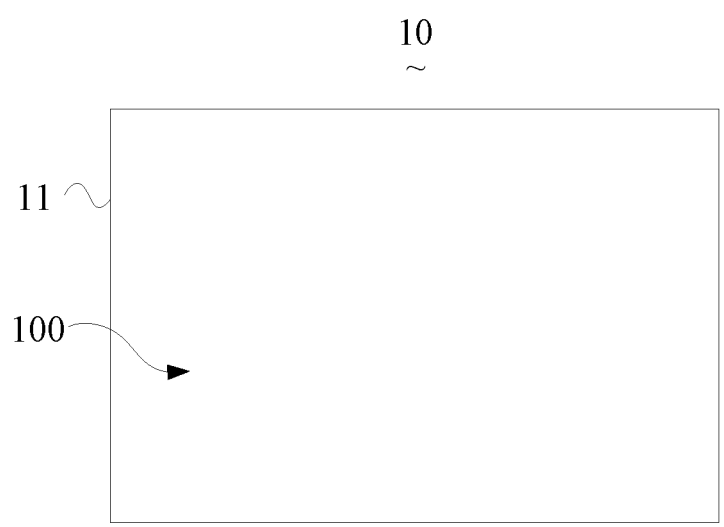
FIG. 6 is a structural illustration of an embodiment made in accordance to a display panel in the present invention.

Referring to FIG. 6, FIG. 6 is a structural illustration of an embodiment made in accordance to a display panel in the present invention.

As shown in FIG. 6, the display panel 10 comprises a housing 11 and an array substrate described above, the array substrate is arranged inside the housing 11, wherein the array substrate is the array substrate 100, the array substrate 200, or the array substrate 300 described above.

Wherein, the structure of the array substrate 100, the array substrate 200, or the array substrate 300 are referred to the above description, therefore no additional description is given herebelow In summary, skilled in the arts appreciate that the array substrate provided by the present invention comprises the wire on array arranged in different metal layers to extend the length of the wire on array and increase the impedance of the wire on array. Thereby the input current of gate driving circuit can be decreased and the probability of gate driving circuit damage can be reduced, the electrostatic protection of the array substrate can be improved.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

The invention claimed is:

1. An array substrate, wherein the array substrate comprises a display region and a peripheral wiring region;

wherein the display region comprises a plurality of sub-pixel electrodes arranged in a matrix manner, scanning lines arranged in correspondence with each row of the sub-pixel electrodes, and data lines arranged in correspondence with each column of the sub-pixel electrodes;

wherein in the peripheral wiring region, gate driving circuits are arranged in correspondence with each of the scanning lines and data driving lines are arranged in correspondence with each of the data lines, and the gate driving circuits and the data driving lines are electrically connected to a film region of a chip, each of wires in array connecting the gate driving circuits to the film region of the chip is arranged on different metal layers to improve the electrostatic protection of the array substrate;

wherein a distance between the adjacent wires is in the range of 10 to 30 μm, a starting point of each of the wires in array connected to the gate driving circuit and an end point connected to the film region of the chip are arranged in the same metal layer.

2. A display panel, wherein the display panel comprises a housing and an array substrate as recited in claim 1, wherein the array substrate comprises a display region and a peripheral wiring region;

wherein the display region comprises a plurality of sub-pixel electrodes arranged in a matrix manner, scanning lines arranged in correspondence with each of the sub-pixel electrodes, and data lines arranged in correspondence with each of the sub-pixel electrodes;

wherein in the peripheral wiring region, gate driving circuits arranged in correspondence with each of the scanning lines and data driving lines are arranged in correspondence with each of the data lines, and the gate driving circuits and the data driving lines are electrically connected to a film region of a chip, each of wires in array connecting the gate driving circuits to the film region of the chip are arranged on different metal layers to improve the electrostatic protection of the array substrate.

3. The display panel as recited in claim 2, wherein a starting point of each of the wires in array connected to the gate driving circuit and an end point connected to the film region of the chip are arranged in the same metal layer.

4. The display panel as recited in claim 3, wherein the different metal layers comprise a first metal layer and a second metal layer, the wire arranged on the first metal layer and the second metal layer has a length range of more than 100 μm.

5. The display panel as recited in claim 4, wherein the wire arranged on the first metal layer and the second metal layer is electrically connected via a through hole of a gate insulating layer.

6. The array substrate as recited in claim 5, wherein the diameter of the through hole is equal to the width of the wire.

7. The array substrate as recited in claim 6, wherein the width of the wire is in the range of 10 to 30 μm.

8. The array substrate as recited in claim 2, wherein a distance between the adjacent wires is in the range of 10 to 30 μm.

9. The array substrate as recited in claim 4, wherein the first metal layer comprises a plurality of first metal segments, the second metal layer comprises a plurality of second metal segments, and the plurality of first metal segments are electrically connected to the plurality of corresponding second metal segments.

10. The array substrate as recited in claim 9, wherein the wires in array are further divided into a first wire region and a second wire region, the plurality of the first metal segments in the first wire region and the plurality of the first metal segments in the second wire region are arranged separately on the same layer.

11. An array substrate, wherein the array substrate comprises a display region and a peripheral wiring region;

wherein the display region comprises a plurality of sub-pixel electrodes arranged in a matrix manner, scanning lines arranged in correspondence with each of the sub-pixel electrodes, and data lines arranged in correspondence with each of the sub-pixel electrodes;

wherein in the peripheral wiring region, gate driving circuits are arranged in correspondence with each of the scanning lines and data driving lines are arranged in correspondence with each of the data lines, and the gate driving circuits and the data driving lines are electrically connected to a film region of a chip, each of wires in array connecting the gate driving circuits to the film region of the chip is arranged on different metal layers to improve the electrostatic protection of the array substrate;

wherein a starting point of each of the wires in array connected to the gate driving circuit and an end point connected to the film region of the chip are arranged in the same metal layer.

12. The array substrate as recited in claim 11, wherein the different metal layers comprise a first metal layer and a second metal layer, the wire arranged on the first metal layer and the second metal layer has a length range of more than 100 μm.

13. The array substrate as recited in claim 12, wherein the wire arranged on the first metal layer and the second metal layer is electrically connected via a through hole of a gate insulating layer.

14. The array substrate as recited in claim 13, wherein the diameter of the through hole is equal to the width of the wire.

15. The array substrate as recited in claim 14, wherein the width of the wire is in the range of 10 to 30 μm.

16. The array substrate as recited in claim 12, wherein the first metal layer comprises a plurality of first metal segments, the second metal layer comprises a plurality of second metal segments, and the plurality of first metal segments is electrically connected to the plurality of corresponding second metal segments.

17. The array substrate as recited in claim 16, wherein the wires in array are further divided into a first wire region and a second wire region, the plurality of the first metal segments in the first wire region and the plurality of the first metal segments in the second wire region are arranged separately on the same layer.

18. The array substrate as recited in claim 11, wherein a distance between the adjacent wires is in the range of 10 to 30 μm.

* * * * *